United States Patent [19]
Li et al.

[11] Patent Number: 6,070,551
[45] Date of Patent: Jun. 6, 2000

[54] DEPOSITION CHAMBER AND METHOD FOR DEPOSITING LOW DIELECTRIC CONSTANT FILMS

[75] Inventors: Shijian Li; Yaxin Wang, both of San Jose; Fred C. Redeker, Fremont; Tetsuya Ishikawa, Santa Clara; Alan W. Collins, San Francisco, all of Calif.

[73] Assignee: Applied Materials, Inc., Santa Clara, Calif.

[21] Appl. No.: 08/851,856

[22] Filed: May 6, 1997

Related U.S. Application Data

[63] Continuation-in-part of application No. 08/647,619, May 13, 1996, abandoned.

[51] Int. Cl.$^7$ .................................................. C23C 16/00
[52] U.S. Cl. ................... 118/723 I; 118/715; 118/733
[58] Field of Search ................... 118/715, 723 I, 118/733

[56] References Cited

U.S. PATENT DOCUMENTS

| | | | |
|---|---|---|---|
| 3,717,439 | 2/1973 | Sakai | 23/277 R |
| 4,118,539 | 10/1978 | Hirai | 428/446 |
| 4,716,852 | 1/1988 | Tsujii | 118/715 |
| 4,817,558 | 4/1989 | Itoh | 118/715 |
| 4,834,022 | 5/1989 | Mahawili | 118/715 |
| 5,069,930 | 12/1991 | Hussia et al. | 427/55 |
| 5,105,761 | 4/1992 | Charlet et al. | 118/723 |
| 5,250,092 | 10/1993 | Nakano | 96/136 |
| 5,304,250 | 4/1994 | Sameshima et al. | 118/723 E |
| 5,346,578 | 9/1994 | Benzing et al. | 156/345 |
| 5,368,646 | 11/1994 | Yasuda et al. | 118/723 R |
| 5,387,289 | 2/1995 | Schmitz et al. | 118/725 |
| 5,447,570 | 9/1995 | Schmitz et al. | 118/728 |
| 5,522,934 | 6/1996 | Suzuki et al. | 118/723 AN |
| 5,525,159 | 6/1996 | Hama et al. | 118/723 I |
| 5,532,190 | 7/1996 | Goodyear et al. | 437/225 |
| 5,554,226 | 9/1996 | Okase et al. | 118/724 |
| 5,614,055 | 3/1997 | Fairbairn et al. | 156/345 |
| 5,620,523 | 4/1997 | Maeda et al. | 118/723 IR |
| 5,772,771 | 6/1998 | Li | 118/723 I |

FOREIGN PATENT DOCUMENTS

| | | | |
|---|---|---|---|
| 0 308 946 | 9/1988 | European Pat. Off. | C30B 25/14 |
| 0 599 730 | 11/1993 | European Pat. Off. | H01L 21/316 |
| 54-111771 | 9/1979 | Japan | H01L 21/31 |
| 61-263118 | 11/1985 | Japan | H01L 21/205 |
| 62-156270 | 7/1987 | Japan | 118/725 |
| 63-260124 | 10/1988 | Japan | 118/715 |
| 1-171228 | 7/1989 | Japan | 118/725 |
| 197803 | 8/1974 | U.S.S.R. | B01J 17/32 |

OTHER PUBLICATIONS

Kaplan et al., "Deposition Method for Aluminum Oxide Films," *IBM Technical Disclosure Bulletin*, vol. 7, No. 5, pp. 414–415 (Oct. 1964).

LAM Research Presentation Paper, "Chemical Vapor Deposition (CVD): SiO$_2$ (F)," in existence as of Apr. 30, 1996.

*Primary Examiner*—Richard Bueker
*Attorney, Agent, or Firm*—Townsend & Townsend & Crew

[57] ABSTRACT

An improved deposition chamber (2) includes a housing (4) defining a chamber (18) which houses a substrate support (14). A mixture of oxygen and SiF$_4$ is delivered through a set of first nozzles (34) and silane is delivered through a set of second nozzles (34a) into the chamber around the periphery (40) of the substrate support. Silane (or a mixture of silane and SiF$_4$) and oxygen are separately injected into the chamber generally centrally above the substrate from orifices (64, 76). The uniform dispersal of the gases coupled with the use of optimal flow rates for each gas results in uniformly low (under 3.4) dielectric constant across the film.

20 Claims, 4 Drawing Sheets

DEPOSITION CHAMBER AND METHOD FOR DEPOSITING LOW DIELECTRIC CONSTANT FILMS

CROSS-REFERENCE TO RELATED APPLICATIONS

This application is a Continuation-In-Part of U.S. patent application "DEPOSITION CHAMBER AND METHOD FOR LOW DIELECTRIC FILMS," U.S. Ser. No. 08/647,619, filed May 13, 1996, having Shijian Li, Yaxin Wang, Fred C. Redeker, Tetsuya Ishikawa and Alan W. Collins as inventors and assigned to Applied Materials, Inc. The Ser. No. 08/647,619 application is hereby incorporated by reference in its entirety.

BACKGROUND OF THE INVENTION

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. Plasma CVD processes promote the excitation and/or dissociation of the reactant gases by the application of radio frequency (RF) energy to the reaction zone proximate the substrate surface thereby creating a plasma of highly reactive species. The high reactivity of the released species reduces the energy required for a chemical reaction to take place, and thus lowers the required temperature for such CVD processes.

In one design of plasma CVD chambers, the vacuum chamber is generally defined by a planar substrate support, acting as a cathode, along the bottom, a planar anode along the top, a relatively short sidewall extending upwardly from the bottom, and a dielectric dome connecting the sidewall with the top. Inductive coils are mounted about the dome and are connected to a source radio frequency (SRF) generator. The anode and the cathode are typically coupled to bias radio frequency (BRF) generators. Energy applied from the SRF generator to the inductive coils forms an inductively coupled plasma within the chamber. Such a chamber is referred to as a high density plasma CVD (HDP-CVD) chamber.

In some HDP-CVD chambers, it is typical to mount two or more sets of equally spaced gas distributors, such as nozzles, to the sidewall and extend into the region above the edge of the substrate support surface. The gas nozzles for each set are coupled to a common manifold for that set; the manifolds provide the gas nozzles with process gases. The composition of the gases introduced into the chamber depends primarily on the type of material to be formed on the substrate. For example, when a fluorosilicate glass (FSG) film is deposited within the chamber, the process gases may include, silane ($SiH_4$), silicon tetrafluoride ($SiF_4$), oxygen ($O_2$) and argon (Ar). Sets of gas nozzles are commonly used because it is preferable to introduce some gases into the chamber separately from other gases, while other gases can be delivered to a common set of nozzles through a common manifold. For example, in the above FSG process it is preferable to introduce $SiH_4$ separately from $O_2$, while $O_2$ and $SiF_4$ can be readily delivered together. The nozzle tips have exits, typically orifices, positioned in a circumferential pattern spaced apart above the circumferential periphery of the substrate support and through which the process gases flow.

As device sizes become smaller and integration density increases, improvements in processing technology are necessary to meet semiconductor manufacturers' process requirements. One parameter that is important in such processing is film deposition uniformity. To achieve a high film uniformity, among other things, it is necessary to accurately control the delivery of gases into the deposition chamber and across the wafer surface. Ideally, the ratio of gases (e.g., the ratio of $O_2$ to ($SiH_4+SiF_4$)) introduced at various spots along the wafer surface should be the same.

FIG. 1 illustrates a typical undoped silicate glass (USG) deposition thickness variation plot 46 for a conventional deposition chamber such as the chamber described above. The average thickness is shown by base line 48. As can be seen by plot 46, there is a relatively steep increase in thickness at end points 50 and 52 of plot 46 corresponding to the periphery 42 of substrate 20. The center 54 of plot 46 also dips down substantially as well.

U.S. patent application Ser. No. 08/571,618 filed Dec. 13, 1995, the disclosure of which is incorporated by reference, discloses how plot 46 can be improved through the use of a center nozzle 56 coupled to a third gas source 58 through a third gas controller 60 and a third gas feed line 62. Center nozzle 56 has an orifice 64 positioned centrally above substrate support surface 16. Using center nozzle 56 permits the modification of USG deposition thickness variation plot 46 from that of FIG. 1 to exemplary plot 68 of FIG. 2. Exemplary deposition thickness variation plot 68 is flat enough so that the standard deviation of the deposition thickness can be about 1 to 2% of one sigma. This is achieved primarily by reducing the steep slope of the plot at end points 50, 52 and raising in the low point at center 54 of plot 46.

With the advent of multilevel metal technology in which three, four, or more layers of metal are formed on the semiconductors, another goal of semiconductor manufacturers is lowering the dielectric constant of insulating layers such as intermetal dielectric layers. Low dielectric constant films are particularly desirable for intermetal dielectric (IMD) layers to reduce the RC time delay of the interconnect metallization, to prevent cross-talk between the different levels of metallization, and to reduce device power consumption.

Many approaches to obtain lower dielectric constants have been proposed. One of the more promising solutions is the incorporation of fluorine or other halogen elements, such as chlorine or bromine, into a silicon oxide layer. It is believed that fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluoro silicate glass (FSG) films.

From the above, it can be seen that it is desirable to produce oxide films having reduced dielectric constants such as FSG films. At the same time, it is also desirable to provide a method to accurately control the delivery of process gases to all points along the wafer's surface to improve characteristics such as film uniformity. As previously discussed, one method employed to improve film deposition uniformity is described in U.S. patent application Ser. No. 08/571,618 discussed above. Despite this improvement, new techniques for accomplishing these and other related objectives are continuously being sought to keep pace with emerging technologies.

SUMMARY OF THE INVENTION

The present invention is directed toward an improved deposition chamber that incorporates an improved gas delivery system. The gas delivery system helps ensure that the proper ratio of process gases is uniformly delivered across a wafer's surface. The present invention is also directed toward a method of depositing FSG films having a low dielectric constant and improved uniformity. This is achieved by a combination of (1) the uniform application of the gases (preferably silane, fluorine-supplying gases such as $SiF_4$ or $CF_4$, and oxygen-supplying gases such as $O_2$ or $N_2O$) to the substrate and (2) the selection of optimal flow rates for the gases, which preferably have been determined as a result of tests using the particular chamber. In some embodiments, the deposited FSG film has a dielectric constant as low as 3.4 or 3.3. Preferably, the dielectric constant of the FSG film is at least below 3.5.

The improved deposition chamber includes a housing defining a deposition chamber. A substrate support is housed within the deposition chamber. A first gas distributor has orifices or other exits opening into the deposition chamber in a circumferential pattern spaced apart from and generally overlying the circumferential periphery of the substrate support surface. A second gas distributor, preferably a center nozzle, is used and is positioned spaced apart from and above the substrate support surface, and a third gas distributor delivers an oxygen-supply gas (e.g., $O_2$) to the chamber through the top of the housing in a region generally centrally above the substrate. This is preferably achieved by passing the oxygen through an annular orifice created between the center nozzle carrying the silane (and any other gases) and a hole in the top of the housing. In one embodiment the first gas distributor includes first and second sets of nozzles.

In one embodiment of the method of the present invention, an FSG film is deposited from a process gas that includes silane, oxygen and $SiF_4$. Oxygen and $SiF_4$ are delivered together to the chamber through the first set of nozzles, and silane (or silane and $SiF_4$) is delivered through the second set of nozzles. Mixing the $SiF_4$ with oxygen and introducing this combination through the first set of nozzles reduces equipment complexity so cost can be reduced. Silane (or silane and $SiF_4$) is also injected into the vacuum chamber from the second gas distributor to improve the uniform application of the gases to the substrate over that which is achieved without the use of the second gas distributor, and oxygen is delivered through the third gas distributor. In this way, oxygen is provided both from the sides through the first set of nozzles of the first gas distributors, preferably mixed with $SiF_4$, and also in the same region as silane above the substrate. Also, the passage of the oxygen through the annular orifice keeps reactive gases within the chamber from attacking the seals used between the top of the housing and the body from which the center nozzle extends. This advantage is retained if silane is passed through the annular orifice and oxygen through the center nozzle.

Film thickness and dielectric constant uniformity is also enhanced by ensuring that the temperature of the substrate remains uniform across the substrate and using a source RF generator designed to achieve sputtering uniformity.

One of the primary aspects of the method of the present invention is the recognition that it is very important to ensure the uniform distribution of oxygen entering the chamber. This is achieved by flowing oxygen both from the top of the chamber and from the sides of the chamber. Additionally, by the appropriate configuration of the oxygen flow path through the top of the chamber, the oxygen can serve to protect the sealing element from deleterious effects of coming in contact with reactive gases such as fluorine.

In addition to the need to supply the gases to the substrate uniformly, it is necessary to use the correct proportion of the gases, for example $O_2$, $SiH_4$ and $SiF_4$, to deposit a stable film and achieve a minimum dielectric constant for that film. The proper flow rates for each will differ according to the particular chamber used. Accordingly, it is a further aspect of the invention to test a variety of flow rate proportions to discover which set of flow rates provides a high quality dielectric film with a minimum dielectric constant.

Other features and advantages of the invention will appear from the following description in which the preferred embodiments have been set forth in detail in conjunction with the accompanying drawings.

DESCRIPTION OF THE PREFERRED EMBODIMENTS

Figure 1:
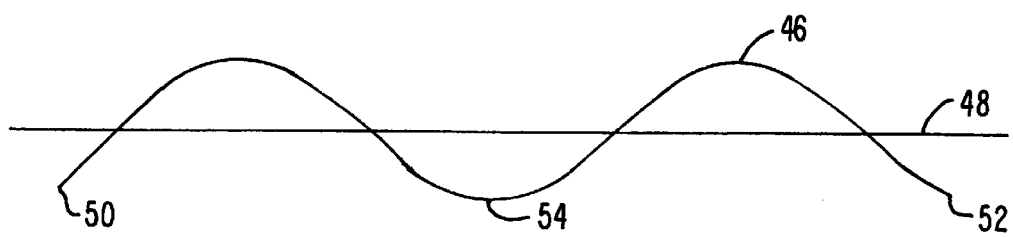
FIG. 1 is an exaggerated view illustrating the characteristic M-shaped, deposition thickness variation plot of the prior art.
Figure 2:
FIG. 2 illustrates an improvement in the deposition thickness variation plot of FIG. 1 using the apparatus of U.S. patent application Ser. No. 08/571,618.
Figure 3:
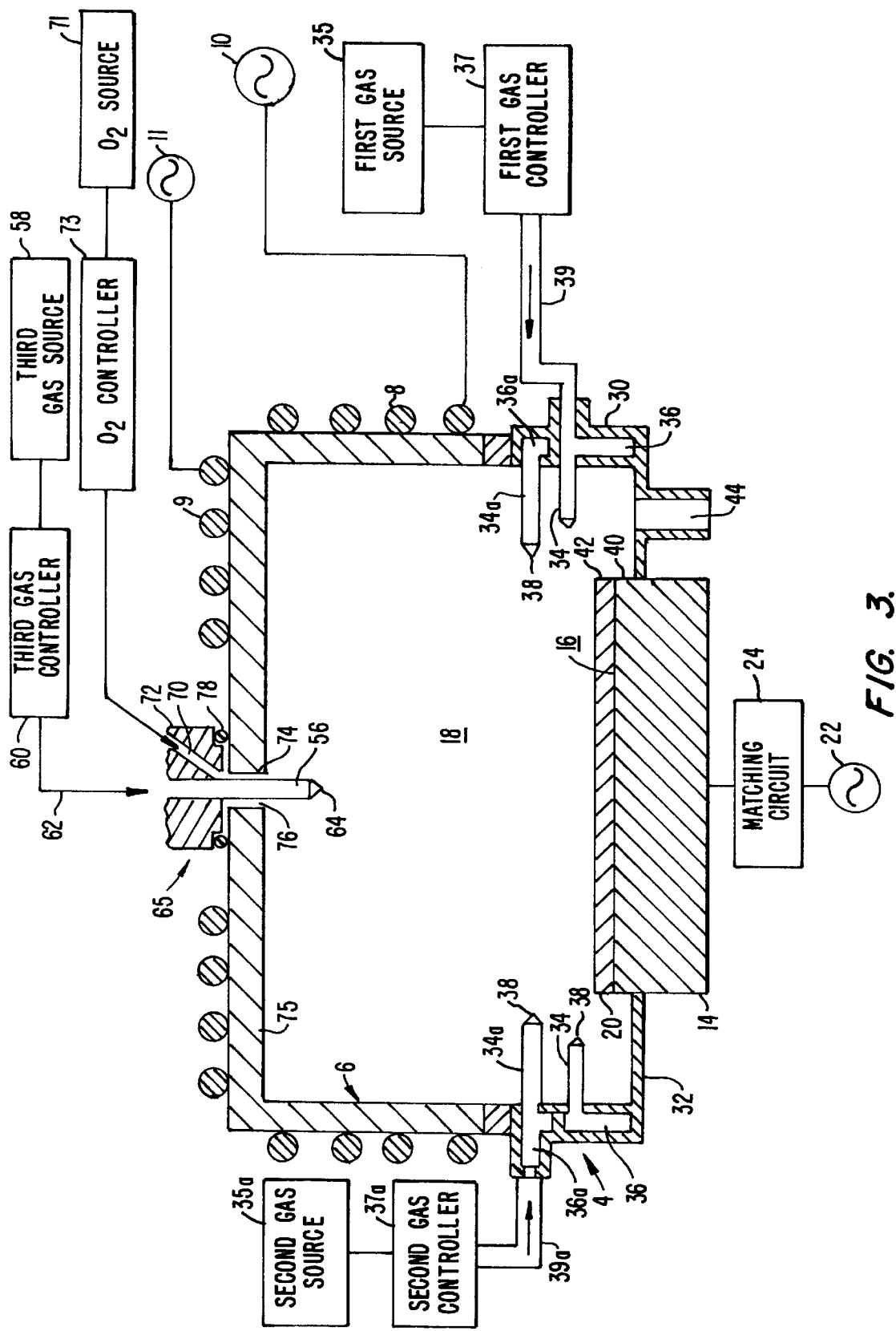
FIG. 3 is a schematic cross-sectional view showing a deposition chamber made according to one embodiment of the invention.

FIG. 3 illustrates a deposition chamber 2 comprising a housing 4, the housing including a generally cylindrized dielectric enclosure 6 surrounded by two sets of RF inductive coils 8, 9. Enclosure 6 could be made of RF transparent materials other than a dielectric material. Coils 8, 9 are powered by a pair of source RF generators 10, 11. Chamber 2 also includes a water-cooled substrate support 14 having a substrate support surface 16 within the vacuum chamber 18 defined within housing 4. Surface 16 is used to support a substrate 20 within chamber 18. Substrate support 14 acts as a cathode and is connected to a bias RF generator 22 through a matching circuit 24. A generally cylindrical sidewall 30 of housing 4 connects the bottom 32 of housing 4 to dielectric enclosure 6. Sidewall 30 acts as the anode.

Process gases are introduced to vacuum chamber 18 in the region surrounding substrate 20 through two sets of twelve equally spaced nozzles 34, 34a. Nozzles 34, 34a are arranged in a ring-like pattern and are fluidly coupled to gas manifolds 36, 36a, respectively. Manifolds 36, 36a are fed process gases from first and second gas sources 35, 35a through first and second gas controllers 37, 37a and first and second gas feed lines 39, 39a. Each nozzle 34, 34a has an orifice 38 at its distal end. The orifices 38 of nozzles 34, 34a are arranged above the periphery 40 of substrate support 14 and thus above the periphery 42 of substrate 20. Vacuum chamber 18 is exhausted through an exhaust port 44.

The various components of chamber 2 are controlled by a processor (not shown). The processor operates under control of a computer program stored in a computer-readable medium (also not shown). The computer program dictates the various operating parameters, such as timing, mixture of gases, chamber pressure, substrate support temperature and RF power levels.

The present invention improves upon the above-described structure by providing an improved gas delivery component 65 positioned above substrate 20. In a preferred embodiment, gas delivery component 65 includes a gas pathway 70 formed in a body 72 mounted to the top 75 of enclosure 6. A center nozzle 56 passes through an opening 74 formed in top 75. Nozzle 56 and opening 74 provide an annular orifice 76 in fluid communication with vacuum chamber 18 and gas pathway 70. A fluid seal 78 is provided between body 72 and top 75. Gas thus proceeds through pathway 70, into a region defined between body 72 and top 75 and bounded by fluid seal 78, and finally along annular orifice 76.

In a preferred embodiment, the apparatus of the present invention is used to deposit FSG films from silane, oxygen and $SiF_4$ precursor gases. In this embodiment, the present invention preferably supplies a combination of $SiF_4$ and oxygen from first gas source 35 for introduction into chamber 18 through orifices 38 of nozzles 34. Doing so simplifies the delivery of these gases and helps reduce cost. Silane ($SiH_4$) is preferably delivered into chamber 18 from second gas source 35a, through second gas controller 37a, and through nozzles 34a. In addition, third gas source 58 is preferably used to introduce silane (or, for example, a mixture of silane and $SiF_4$) into chamber 18 from above substrate 20. In conjunction with this, oxygen is also directed into chamber 18 from a position above substrate 20, but along a flow path separate from the flow path of the silane through pathway 70 and annular orifice 76.

Oxygen can be mixed with a relatively stable gas such as $SiF_4$; however, due to the reactive nature of silane and oxygen, these components must be kept separate until their introduction into chamber 18. To accomplish this, separate nozzles 34, 34a are used in the region around substrate support 14; also oxygen is introduced through gas pathway 70 formed in a body 72. Pathway 70 is coupled to an oxygen source 71 through an oxygen controller 73. Third gas line 62 passes through body 72 and terminates at center nozzle 56. By injecting oxygen in this way, gases, such as fluorine compounds, which could otherwise have a deleterious effect on fluid seal 78, are prevented from reaching the fluid seal by the washing effect or scouring effect of the flowing oxygen. In other embodiments, gases other than oxygen which do not cause seal 78 to deteriorate can also be used.

Another advantage of delivering oxygen through gas pathway 70 is that oxygen has a relatively long residence time as compared to silane or some other gases. Because of the short residence time of silane, when silane is introduced through orifice 76 it may dissociate relatively quickly leading to particle formation within the orifice and upstream of the orifice in pathways 70. Molecular oxygen has a longer residence time than silane, Thus, this is not a problem when oxygen is delivered through orifice 76 instead.

Depositing FSG films in this manner results in stable films (substantially no HF or $H_2O$ outgassing at temperatures up to 450° C.) having dielectric constants of less than 3.5 and even less than 3.4 or 3.3. These low dielectric constant values are achieved in a generally uniform manner over substrate 20. The uniform reduction of the dielectric constant is important because as device sizes are reduced, capacitance between closely spaced conductors will naturally increase. To reduce the capacitance, and thus speed up operation of the devices, the dielectric constant of the deposited dielectric film must be reduced.

In conjunction with the uniformity of gas distribution using the structure discussed above, uniform dielectric constants are also dependent upon temperature uniformity across substrate 20 and sputtering uniformity. See, for example, U.S. patent application Ser. No. 08/641,147, filed Apr. 25, 1996, entitled "Substrate Support with Pressure Zones Having Reduced Contact Area and Temperature Feedback," of inventors B. Lue, T. Ishikawa, F. Redeker, M. Wong and S. Li and assigned to Applied Materials, Incorporated for a description of structure which can be used to achieve more uniform temperature distributions along substrate. U.S. patent application Ser. No. 08/389,888, filed Feb. 15, 1995, entitled "Automatic Frequency Tuning of an RF Power Source of an Inductively Coupled Plasma Reactor" and U.S. patent application Ser. No. 08/507,726, filed Jul. 26, 1995, entitled "Plasma Source with an Electronically Variable Density Profile," also assigned to Applied Materials, Incorporated, teach structure for enhanced sputtering uniformity. The disclosures of all three of these applications are incorporated by reference.

Varying the total flow of $SiF_4$ and silane affects deposition rate and thus throughput. High throughput requires high bias power from bias power source 22 to create high sputtering and high etching rates. High bias power, and thus high throughput, is possible only if temperature uniformity across substrate 20 is achieved since speed of etching is strongly affected by the temperature of the substrate.

The determination of the amounts of $SiF_4$, silane ($SiH_4$) and oxygen to be used creates an entire new layer of complexity. Assuming the total flow rate of silicon (e.g., from $SiH_4$ and $SiF_4$) remains constant, it is believed that several basic statements can be made regarding the use of these various components. If too little oxygen is used, the deposition rate drops dramatically thus making the process much too inefficient. Too little oxygen can leave the film silicon rich with excess free fluorine incorporated into the film. If too much oxygen is used, the resulting film becomes more USG and the dielectric constant becomes high. If too much $SiF_4$ is used, aging problems can result; aging problems result because over time the fluorine, which is not bound tightly in the complex chemistry of the resulting film, gets released causing deterioration of the device. Too much silane will cause the film to behave more like USG and thus result in a dielectric constant at an undesirable level.

The optimal amounts of oxygen, $SiF_4$ and silane at the substrate surface are the stoichiometric proportions. However, flowing stoichiometric proportions of the gases into deposition chambers, including chamber 2 and other deposition chambers, would result in gas proportions at the substrate surface which are not the stoichiometric proportions. The actual proportions of the gas flowing into the deposition chamber needed to achieve stoichiometric proportions at the substrate surface will vary from the stoichiometric proportions at least in part according to the structure of the specific chamber. The more efficient the chamber, the less gas is wasted so that gas flow rates closer to the stoichiometric amounts can be used.

To determine the proper relative flow rates of $SiF_4$, silane and oxygen for a particular chamber to achieve the desirable dielectric constant below 3.5, preferably below 3.4 and more preferably below 3.3, the proportions of the three components could be varied in any desired manner to create a number of dielectric films on substrates 20; the dielectric constant at different positions along each dielectric film could then be measured. However, some limits in the relative amounts are in order. The percentage of $SiF_4$ should be between about 40% to 60% of the total silicon-supplying gas to reduce or eliminate the problems resulting from too much or too little $SiF_4$ and silane. Oxygen should be between about 60% to 100% of the total silicon-supplying gas.

Figure 4:
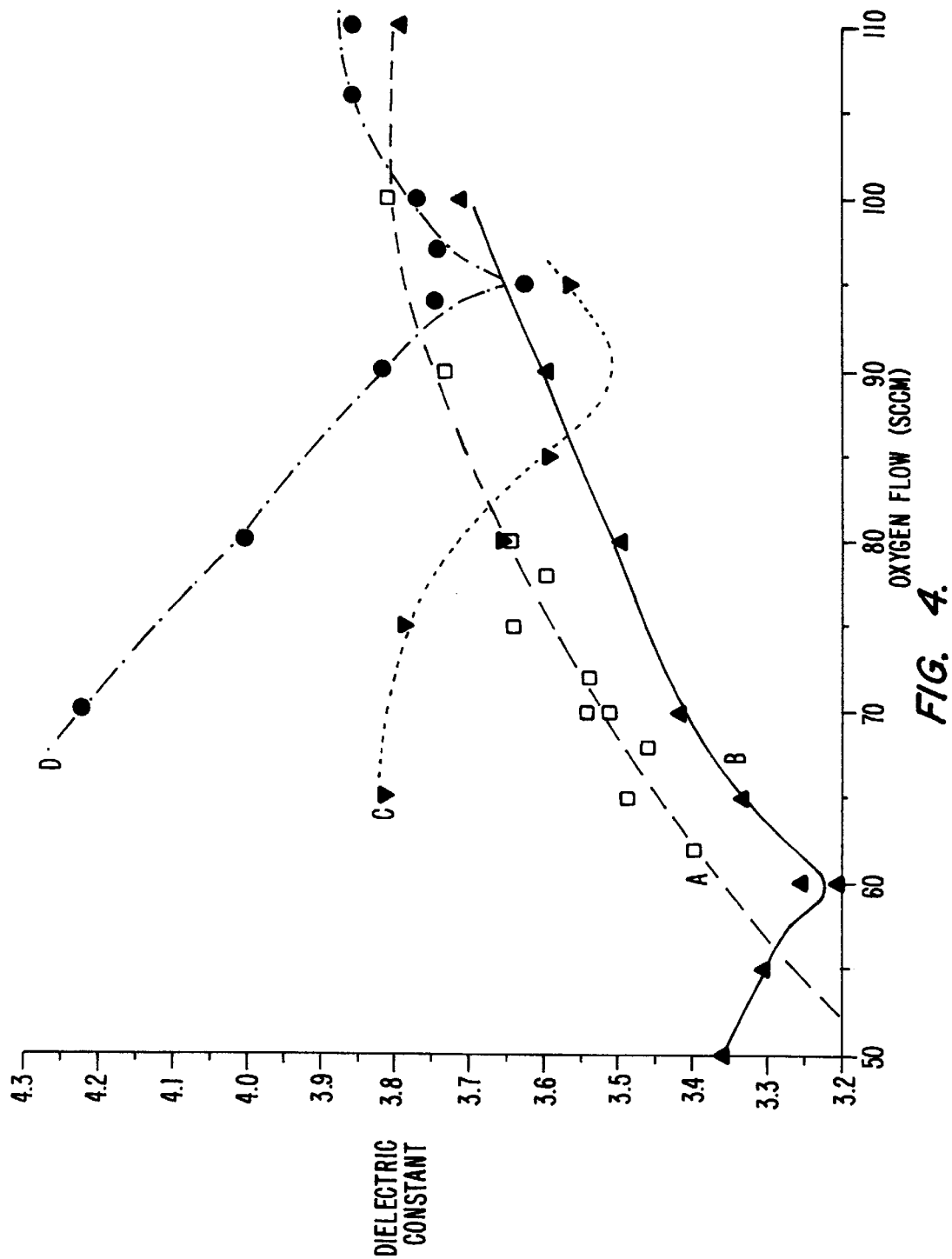
FIG. 4 is a graph of dielectric constant versus oxygen flow for different flow rate ratios of $SiF_4$ to silane.

FIG. 4 illustrates the results of a set of tests conducted varying the ratios of $SiF_4$ to silane to oxygen. It was found that by selecting a total reactive gas flow rate, that is a flow rate for the combination of $SiF_4$ and silane (which results in a constant amount of silicon), dividing that total between $SiF_4$ and silane to arrive at various proportions of $SiF_4$ and silane, and then, using those proportions, varying the oxygen flow, the graph shown in FIG. 4 of dielectric constant to oxygen flow was created. This type of graph provides very useful data.

Plot A, resulting from 44 sccm $SiF_4$ to 36.4 sccm silane, results in a dielectric constant which varies from 3.4 at an oxygen flow of about 62 sccm to about 3.8 at an oxygen flow rate of about 110 sccm. It is not clear from this graph where the minimum dielectric constant would be for this ratio of $SiF_4$ to silane. It appears, however, that the minimum would occur at an unacceptably low oxygen flow rate. Plot B, having an sccm flow rate ratio of $SiF_4$ to silane of 36 to 44.4 provides the lowest dielectric constant: about 3.2 at an oxygen flow of 60 sccm. Plots C and D have minimum dielectric constants of about 3.5 and 3.6 respectively. From this graph it is clear that for these particular ratios of $SiF_4$ to silane, the ratio for Plot B provides the lowest dielectric constant with oxygen flow being at an acceptable level. Reviewing plots A and B suggests that a proportion of $SiF_4$ to silane between the proportions for these two plots may yield a lower dielectric constant than achievable with the proportion for plot B.

Accordingly, the present invention provides a useful and efficient way of determining how to achieve films with low dielectric constants using $SiF_4$ (or another fluorine-supplying gas) and silane chemistry to achieve the reduced dielectric constants. While the above-described method of choosing a single total reactive gas flow rate for each of the tests is presently preferred, other methods for the orderly gathering of dielectric constant information may also be pursued. For example, it may be desired to allow all three variables to change within the overall parameters.

In use, a film having a low dielectric constant can be deposited on substrate 20 by first determining the appropriate flow rates of $SiF_4$, silane and oxygen, typically in the manner discussed above by plotting the results of different tests. Once the desired rate for the particular chamber has been determined, silane is introduced into chamber 18 from second gas source 35a, a mixture of silane and $SiF_4$ is introduced into chamber 18 from third gas source 58, oxygen is introduced into the chamber from oxygen source 71, and a mixture of oxygen and $SiF_4$ is introduced into chamber 18 from first gas source 35. Argon is also introduced from first and third sources 35, 58. Deposition uniformity is also aided by insuring that the temperature of substrate 20 is uniformly controlled over its surface and by the use of a variable frequency source RF generators 10, 11 to help achieve uniform sputtering.

Figure 5:
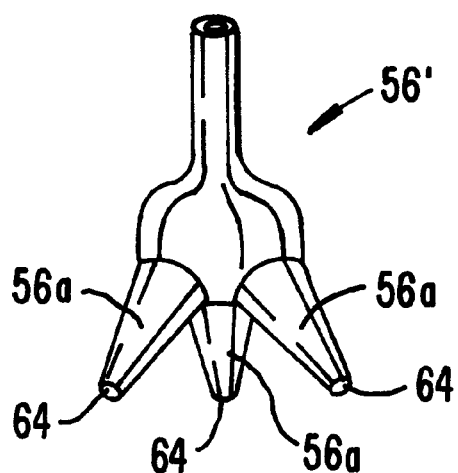
FIG. 5 is a simplified view of an alternative embodiment of the center nozzle of FIG. 3 having three orifices.

The above-described embodiment has been designed for substrates 20 having diameters of 8 inches (20 cm). Larger diameter substrates, such as substrates having diameters of 12 inches (30 cm), may call for the use of multiple center nozzles 56a as illustrated in FIG. 5 by the nozzle assembly 56'. In such embodiments the deposition thickness variation plot would likely have a three-bump (as in FIG. 3), a four-bump or a five-bump shape. The particular shape for the deposition thickness plot would be influenced by the type, number, orientation and spacing of center nozzles 56A and orifices 64.

Figure 6:
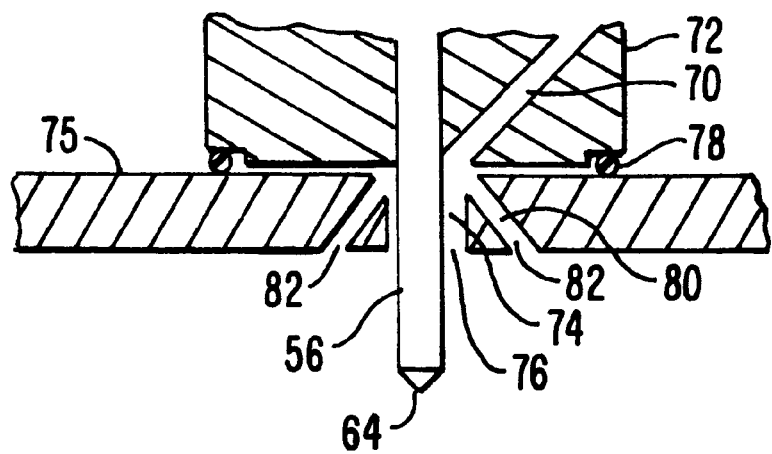
FIG. 6 is a view in the region of the center nozzle showing additional oxygen passageways.

In addition to orifice 76, oxygen may also be directed into chamber 18 through a number of downwardly and outwardly extending passageways 80 as shown in FIG. 6. Each passageway 80 has an orifice 82 where oxygen enters into chamber 18. If desired, other gases, such as argon, may be mixed with one or both of the silane passing through orifice 64 or oxygen passing through annular orifice 76 or orifices 82.

Modification and variation can be made to the disclosed embodiments without departing from the subject of the invention as defined in the following claims. For example, center nozzle 56 could be replaced by a shower head type of gas distributor having multiple exits or a circular array of gas exits. Similarly, nozzles 34, 34a or 56a could be replaced by, for example, a ring or ring-like structure having gas exits or orifices through which the process gases are delivered into chamber 18. While separate nozzles 34, 34a are preferred, a single set of nozzles 34 could be used to supply silane and $SiF_4$ but not oxygen. Orifice 76 can include a plurality of small apertures arranged in a circular fashion around center nozzle 56 rather than an annular ring. Also, oxygen source 71 and third gas source 58 could be switched so that source 71 becomes connected to nozzle 56 and source 58 becomes connected to pathway 70.

Additionally, gases besides silane, oxygen and $SiF_4$ can be employed. Other silicon sources, such as tetraethyloxysilane (TEOS), other oxygen sources, such as $N_2O$, and other fluorine sources such as $C_2F_6 CF_4$ or the like, may be used. Also, the chamber of the present invention can be used to deposit other halogen-doped films, USG films, low k carbon films and others. In some of these embodiments, e.g., some embodiments in which low k carbon films are deposited, oxygen may not be included in the process gas. Thus, other gases, e.g., nitrogen, may be introduced through orifice 76 in these embodiments. These equivalents and alternatives are intended to be included within the scope of the present invention. Other variations will be apparent to persons of skill in the art. Accordingly, it is not intended to limit the invention except as provided in the appended claims.

What is claimed is:

1. A substrate processing system comprising:

a housing defining a chamber;

a substrate support having a substrate support surface within the chamber;

a first gas distributor having first exits opening into the chamber around said substrate support surface;

a second gas distributor having a second exit spaced apart from and generally overlying the central region of said substrate support surface; and a third gas distributor having a third exit opening into said vacuum chamber at a position generally centrally above said substrate support surface, said third exit circumscribing said second exit, the third gas distributor being fluidly isolated from the second gas distributor.

2. The substrate processing system of claim 1 wherein:

said housing comprises a top; and said second gas distributor comprises an extension passing through said top and terminating within said chamber at said second exit.

3. The substrate processing system of claim 2 wherein:

said top defines an access opening through said housing;

said second gas distributor further comprises a body mounted to the top overlying said access opening;

said second gas distributor extension passes through said access opening;

a fluid seal, captured between said body and said top circumscribes said access opening; and a pathway defined in part by said fluid seal and fluidly-coupled to the third exit so that passage of a gas along said pathway helps prevent gas from within the chamber from contacting said seal.

4. The substrate processing system of claim 1 wherein said third exit comprises a plurality of apertures.

5. The substrate processing system of claim 1 wherein said third exit comprises an annular orifice.

6. The substrate processing system of claim 1 wherein the first gas distributor is fluidly coupled to first gas sources for introducing a set of process gases around the substrate support surface, and wherein the second and third gas distributors are fluidly coupled, respectively, to second and third gas sources for introducing the same set of process gases above the substrate support surface.

7. A deposition chamber assembly comprising:

a housing defining a chamber;

a substrate support having a substrate support surface within the chamber;

a first gas distributor having first exits opening into the chamber around and above said substrate support surface;

a second gas distributor having a second exit spaced apart from and generally overlying the central region of said substrate support surface; and an oxygen-supplying gas distributor having a third exit opening into said vacuum chamber at a position generally centrally above said substrate support surface.

8. The chamber according to claim 7 wherein:

said housing comprises a top, said top defining an access opening therethrough;

a chosen one of said oxygen-supplying and second gas distributors comprises a body mounted to the top overlying said access opening;

said chosen second gas distributor comprises an extension passing through said access opening and terminating within said vacuum chamber at said second exit;

a fluid seal, captured between said body and said top, circumscribing said access opening; and a pathway defined in part by said fluid seal and fluidly coupled to the exit of the other of said gas distributor so that passage of a gas along said oxygen-supplying pathway helps to prevent gas from within said chamber from contacting said seal.

9. The chamber according to claim 8 wherein the other of said gas distributors is said oxygen-supplying gas distributor.

10. The chamber according to claim 8 wherein said housing comprises a dielectric enclosure, said dielectric enclosure comprising said top.

11. The chamber according to claim 8 wherein said pathway comprises a path portion surrounding said extension passing through said access opening.

12. The chamber according to claim 8 wherein said pathway comprises a plurality of outwardly and downwardly extending path portions spaced apart from said extension and defining additional ones of the exits of the other of said gas distributors.

13. The chamber according to claim 7 wherein the oxygen-supplying gas distributor comprises a plurality of said third exits.

14. The chamber according to claim 7 further comprising inductive coils mounted to the housing and coupled to a radio frequency generator.

15. The chamber according to claim 7 wherein the first gas distributors include a plurality of nozzles equally spaced about the center of the substrate support surface.

16. The chamber according to claim 7 wherein said first gas distributor comprises first and second sets of nozzles, said first set of nozzles being fluidly isolated from said second set of nozzles.

17. The chamber according to claim 7 wherein the second gas distributor includes a nozzle and said second exit includes a single orifice.

18. The chamber according to claim 7 wherein the second gas distributor includes a plurality of nozzles and said second exit includes a plurality of orifices.

19. An improved deposition chamber of the type comprising a vacuum chamber housing a substrate support and a process gas distributor with first process gas exits positioned around and above the substrate support, the improvement comprising:

a second process gas distributor having a second process gas exit spaced apart from and generally centrally above the substrate support; and an oxygen-supplying gas distributor having a third exit spaced apart from and generally centrally above the substrate support.

20. The improved deposition chamber according to claim 19 wherein said second process gas exit is defined by a nozzle and said third exit circumscribes said nozzle.

* * * * *